US011506687B2

(12) United States Patent
Stewart et al.

(10) Patent No.: US 11,506,687 B2
(45) Date of Patent: Nov. 22, 2022

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventors: Kevin Alexander Stewart, Gresham, OR (US); Martin Kejhar, Roznov pod Radhostem (CZ); Radim Mlcousek, Frenstat pod Radhostem (CZ); Arash Elhami Khorasani, Phoenix, AZ (US); David T. Price, Gresham, OR (US); Mark Griswold, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 314 days.

(21) Appl. No.: 17/011,027

(22) Filed: Sep. 3, 2020

(65) Prior Publication Data

US 2022/0003800 A1 Jan. 6, 2022

Related U.S. Application Data

(60) Provisional application No. 63/047,037, filed on Jul. 1, 2020.

(51) Int. Cl.
| | |
|---|---|
| *G01R 15/14* | (2006.01) |
| *G01R 19/00* | (2006.01) |
| *H01L 27/06* | (2006.01) |
| *H01L 49/02* | (2006.01) |
| *H01L 29/808* | (2006.01) |

(52) U.S. Cl.
CPC ....... *G01R 15/144* (2013.01); *G01R 19/0084* (2013.01); *H01L 27/0629* (2013.01); *H01L 28/24* (2013.01); *H01L 29/808* (2013.01)

(58) Field of Classification Search
CPC ........ G01R 15/00; G01R 15/04; G01R 15/06; G01R 15/14; G01R 15/144; G01R 19/00; G01R 19/0084; G01R 19/0092; H01L 27/00; H01L 27/02; H01L 27/04; H01L 27/06; H01L 27/0611; H01L 27/0617; H01L 27/0629; H01L 27/0688; H01L 28/00; H01L 28/20; H01L 28/24; H01L 29/00; H01L 29/66; H01L 29/68; H01L 29/76; H01L 29/772; H01L 29/80; H01L 29/806; H01L 29/808
USPC ...... 324/76.11, 126, 522, 713; 702/1, 57, 64
See application file for complete search history.

(56) References Cited

U.S. PATENT DOCUMENTS

| | | | |
|---|---|---|---|
| 8,349,625 B2* | 1/2013 | Hall | H01L 28/20 438/10 |
| 2002/0102806 A1 | 8/2002 | Bailey et al. | |
| 2006/0163691 A1* | 7/2006 | Hall | H01L 27/0288 257/E29.054 |

(Continued)

*Primary Examiner* — Hoai-An D. Nguyen
(74) *Attorney, Agent, or Firm* — Robert F. Hightower

(57) ABSTRACT

In one embodiment, a method of forming a semiconductor device may include forming a sense resistor to receive a high voltage signal and form a sense signal that is representative of the high voltage signal. An embodiment of the sense resistor may optionally be formed overlying a polysilicon resistor. The method may also have an embodiment that may include forming a plurality of capacitors in parallel to portions of the sense resistor wherein the plurality of capacitors are connected together in series.

20 Claims, 5 Drawing Sheets

(56) References Cited

U.S. PATENT DOCUMENTS

| | | | |
|---|---|---|---|
| 2008/0042242 A1* | 2/2008 | Hall | H02M 1/32 |
| | | | 257/E29.054 |
| 2010/0022064 A1* | 1/2010 | Hall | H01L 23/5228 |
| | | | 257/E21.004 |
| 2010/0304511 A1 | 12/2010 | Hall et al. | |
| 2012/0139012 A1* | 6/2012 | Disney | H01L 29/1075 |
| | | | 257/256 |
| 2015/0001677 A1 | 1/2015 | Palumbo et al. | |
| 2019/0067190 A1 | 2/2019 | Wu et al. | |

\* cited by examiner

METHOD OF FORMING A SEMICONDUCTOR DEVICE

CROSS-REFERENCE TO RELATED APPLICATION

This application claims the benefit of U.S. Provisional Patent Application No. 63/047037, filed on Jul. 1, 2020, the entire contents of which is incorporated herein by reference.

BACKGROUND

The present invention relates, in general, to electronics, and more particularly, to semiconductors, structures thereof, and methods of forming semiconductor devices.

In the past, the electronics industry utilized various methods and structures to form circuits that provide sense signals that were representative of a high-voltage (HV) signal. In some cases, the high-voltage may have been a line voltage such as the voltage from a household mains circuit or may have been a higher voltage such as voltages from five hundred to seven hundred volts (500-700 V). In some applications, the sense signal did not accurately represent the lower voltage values of the high-voltage signal. For example, the HV signal may have been a signal that varied between a low voltage, such as for example approximately zero, and higher values. In some applications, the previous circuits did not accurately respond to rapid changes of the HV signal. For example, when the HV signal was increasing from a low value to a higher value, the rate of change may have been faster than the response time of the previous circuits. In some embodiments, the previous circuits may have had distortion in the sense signal during the portion of time that the HV signal was experiencing rapid increases or decreases in the value of the signal.

Accordingly, it is desirable to have a method and circuit that more accurately senses the voltage level, or that can respond to a higher rate of change of the HV signal.

Figure 1:
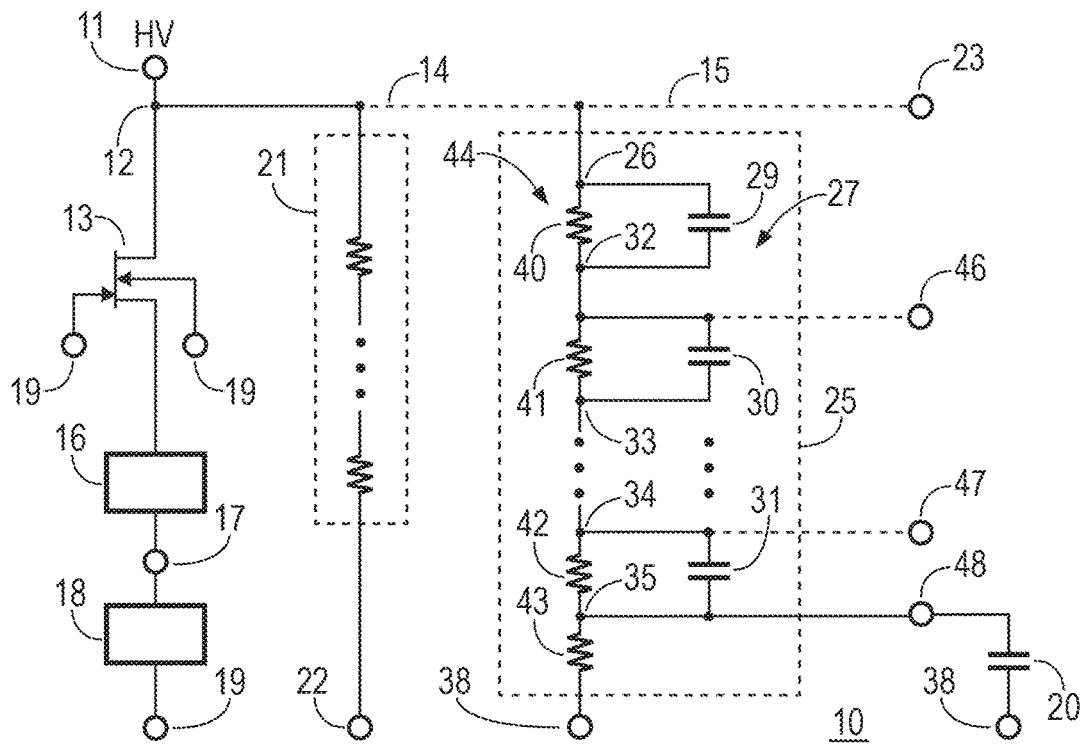
FIG. 1 schematically illustrates an example of a portion of an embodiment of a circuit that is configured to form a sense signal in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of a transistor such as an MOS transistor or a high electron mobility transistor (HEMT), or an emitter or a collector of a bipolar transistor, or a cathode or anode of a diode, and a control element or control electrode means an element of the device that controls current through the device such as a gate of an MOS transistor, a gate of a HEMT, or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter may have embodiments and/or may be practiced in the absence of any element which is not specifically disclosed herein.

DETAILED DESCRIPTION OF THE DRAWINGS

FIG. 1 schematically illustrates an example of a portion of an embodiment of a circuit 10 that is configured to receive a high-voltage (HV) signal on an input terminal or input 11 and form a sense signal on an output 48 that is representative of the high-voltage. A connection to receive the HV signal may be an optional connection illustrated by a dashed line 14. Circuit 10 may have an embodiment configured to form one or more sense signals, such as for example on one or more of outputs 46-48. The one or more sense signals may be formed at a low voltage that are representative of the high-voltage (HV) signal, such as for example the HV signal received on input 11 and through the optional connection of dashed line 14. The HV signal received on input 11 may be an a.c. signal or alternately a d.c. signal, such as a full or half-wave rectified a.c. signal, or may be other types of signals that vary over a time interval.

An alternate embodiment may include that circuit 10 may be configured to receive a HV signal from an optional input 23 through an optional connection that is illustrated by a dashed line 15. For example, the connection of line 14 may be omitted. In an embodiment, input 23 may be configured to receive a HV signal, such as for example a signal from a bridge node of a switching power supply. Those skilled in the art will appreciate that such a bridge node may include a signal that switches between a low voltage and a high voltage and may have a very high slew rate. Alternately, input 23 may be configured to receive a different HV signal including a HV signal similar to the HV signal on input 11.

An embodiment of circuit 10 may include a high-voltage control element, such as for example a transistor 13, that is configured to receive the high-voltage signal and form a signal on an output 17. An embodiment of transistor 13 may be a junction FET or JFET, or alternately a MOSFET. In an embodiment, the signal on output 17 may be an output current having a value that is controlled by the high-voltage control element. Circuit 10 may also include control circuits, such as for example circuits 16 and 18 that assist in forming the signal on output 17. Circuit 18 may have an embodiment that may be connected to a terminal 19 that receives a common voltage. In an embodiment, the common voltage on terminal 19 may be a common return voltage such as, for example a ground voltage, but may be other voltages in other embodiments. Circuit 10 may also include a field plate circuit, illustrated as a resistor 21, that has a first terminal connected to receive the high-voltage (HV) signal on input 11 and has a second terminal 22 that may be connected to another potential. In an embodiment, terminal 22 may be connected to a common return, such as for example a ground potential or other common reference voltage that is used for circuit 10, but may be connected to other voltages in other embodiments. In some embodiments, terminal 22 may be connected to terminal 19. Those skilled in the art will appreciate that the field plate circuit, for example resistor 21, is configured to assist in increasing the breakdown voltage of circuit 10. However, an embodiment of the field plate circuit may not be used to form a sense signal or other signal that is representative of the high-voltage (HV) signal on input 11. Another embodiment may include that the field plate circuit may be used to sense a current or alternately slowly varying signals. In an example embodiment, the connection of dashed line 14 may be omitted, and resistor 21 may receive the HV signal on input 11 that may vary at a frequency of approximately 50-60 Hertz, and circuit 25 may receive a HV signal on input 23 that changes at a faster rate. In some embodiments, an external capacitor 20 may optionally be connected to output 48 to assist in the functioning of a load (not shown) that receives the sense signal from output 48.

A sensing circuit 25 of circuit 10 is configured to receive the high-voltage (HV) signal and form the one or more sense signals on one or more of outputs 46-48. Circuit 25 has an input 26 that is configured to receive the high-voltage (HV) signal from input 11, or alternately from input 23, and also has a reference terminal 38 that is configured to be connected to a reference signal that assist in forming the sense signals. Terminal 38 may have an embodiment that may be connected to a common reference voltage or common return, such as for example a ground reference, or other reference signal. Circuit 25 includes a resistor circuit 44 that has a plurality of resistor sections 40-43 that are connected together in series to form circuit 44. Circuit 25 also includes a capacitor circuit 27 that includes a plurality of capacitors 29-31 that are connected together in series and that are also connected in parallel with respective sections 40-42 of circuit 44. Although four resistor sections 40-43 and three capacitors 29-31 are illustrated, those skilled in the art will appreciate that circuit 44 may include more than four resistor sections and circuit 27 may include more than three capacitors as illustrated by the dotted lines in the string for each of circuits 27 and 44. An embodiment may include that capacitor 29 is connected in parallel to section 40, capacitor 30 is connected in parallel to section 41, and capacitor 31 is connected in parallel to section 42.

Circuit 44 assists in improving the bandwidth and frequency response for circuit 10. An embodiment may include that circuit 44 assists increasing the bandwidth by approximately two orders of magnitude. Capacitors 29-31 also assist in improving the bandwidth and frequency response for circuit 10 by approximately an additional two orders of magnitude. The increased bandwidth improves the transient response of circuit 10. For example, capacitors 29-31 may compensate for parasitic capacitances that could otherwise reduce the bandwidth. One example embodiment had a bandwidth that was no less than approximately ten megaHertz (10 MHz). Because capacitors 29-31 are connected together in series, the HV signal is dropped across the series connected capacitors, thus, each capacitor only has to withstand a portion of the HV signal. In one example embodiment, the HV signal had a value of about seven hundred volts (700 V), but each capacitor may only have to withstand about forty volts (40 V).

Figure 2:
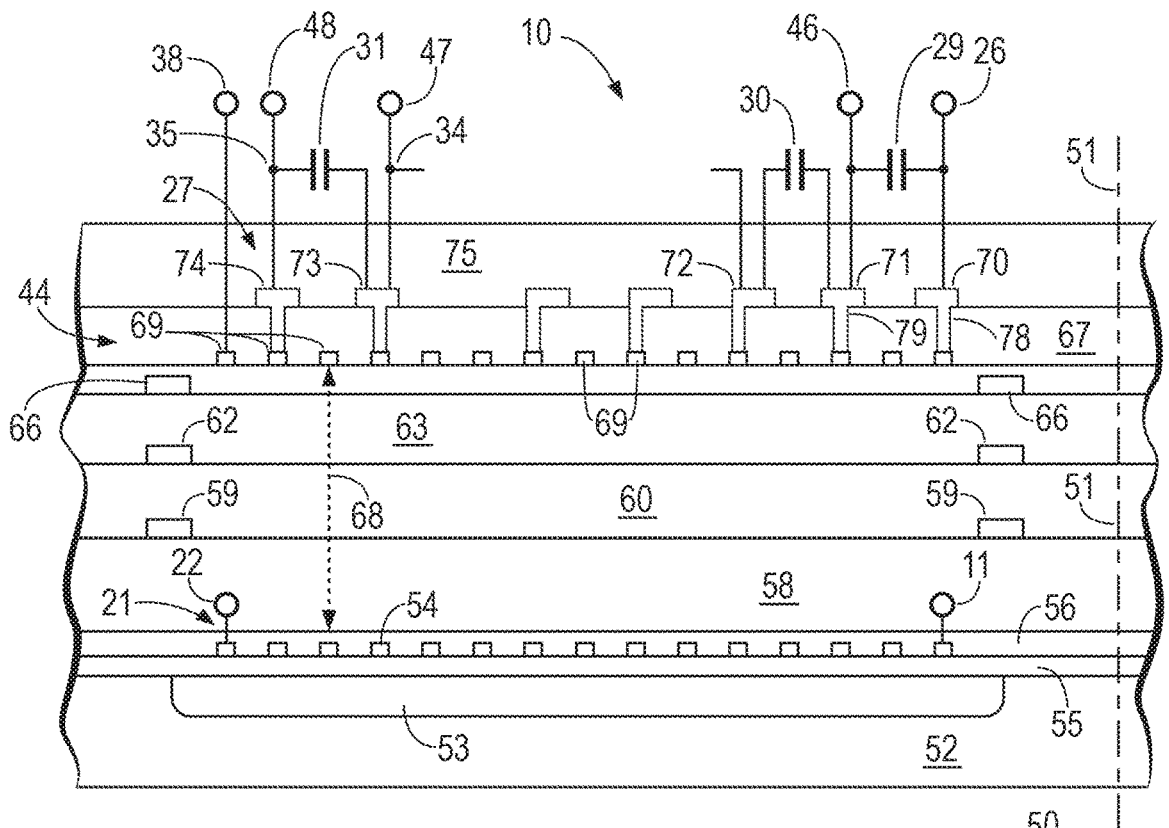
FIG. 2 illustrates an enlarged cross-sectional view of an example of a portion of an embodiment of a semiconductor circuit or semiconductor device that includes an embodiment of the circuit of FIG. 1 in accordance with the present invention.

FIG. 2 illustrates an enlarged cross-sectional view of an example of a portion of an embodiment of a semiconductor circuit or semiconductor device 50 that includes an embodiment of circuit 10. Circuit 10 is formed on a semiconductor substrate 52. A doped region 53 is formed on substrate 52 and is part of an active area of device 50, such as for example a portion of transistor 13. In an embodiment, region 53 may form a depletion region during operation which assists in improving the breakdown voltage of device 50 and circuit 10. Resistor 21 is formed as a polysilicon material 54 that is formed in a long substantially continuous strand that is shaped into a pattern overlying region 53. During operation of device 50, a voltage drop is formed along the length of resistor 21, thus along the length of material 54. In an embodiment, material 54 may be formed on an insulator 55 that overlies region 53. As will be seen further hereinafter, device 50 may be formed into one of several different geometric shapes or patterns. For example, device 50 may be formed in a circular multiply-connected shape around a central axis line 51. Those skilled in the art will understand that "multiply-connected topology" or "multiply-connected shape" or "multiply-connected" means a class of connected shape(s) or domain(s) that have an opening or hole in the shape, such as for example a doughnut having a doughnut hole through the middle of the doughnut. The periphery of the shape can be a circle or a parallelogram or any other shape including an irregular shape. As will be seen further hereinafter, device 50 may be formed into other patterns including other geometric patterns.

A plurality of insulator layers or insulators 58, 60, and 63 may be formed overlying resistor 21 and material 54. Insulators 58, 60, and 63 may be various types of insulator materials such as silicon dioxide, silicon nitride, or other well-known insulator materials. Insulators 58, 60, and 63 may be inter-layer dielectric materials that are used to insulate and isolate different conductor interconnect layers. For example, conductors 59 and may be formed on insulator 58 and used to interconnect various elements of device 50. Similarly, conductors 62 may be formed on insulator 60 and conductor 66 may be formed on insulator 63.

Circuit 44 is formed as a resistor material 69 that is formed on insulator 63. Alternately, an insulator 67 may be formed on insulator 63 and material 69 may be formed on or alternately within insulator 67 overlying insulator 63. In an embodiment, material 69 may be formed to be substantially centered vertically within insulator 67. Material 69 of circuit 44 is spaced a distance 68 from material 54 of resistor 21. In an embodiment, distance 68 may be measured substantially perpendicular to the top surface of substrate 52. Although three insulator layers 58, 60, and 63 are illustrated, the number of insulator layers within distance 68 may be more or less than three as long as material 69 is spaced distance 68 from material 54. Spacing material 69 at least distance 68 from material 54 assists in reducing parasitic capacitive coupling from resistor 44 to substrate 52. Distance 68 may have an embodiment that is between approximately one (1) micron to approximately ten (10) microns from substrate 52. An embodiment of distance 68 may be no less than approximately one-tenth of a micron. In an embodiment, material 69 is formed in a pattern substantially the same as the pattern of material 54 so that the potential drop along the length of material 69 is substantially the same as the potential drop along material 54. For example, the potential drop from input 26 to terminal 38. An embodiment of circuit 44 may be formed as a thin film resistor, thus, material 69 may be a thin film resistor material. Material 69 may have an embodiment that is a silicon-chrome alloy. Other resistor materials may be used in other embodiments such as a nickel-chrome alloy, or a silicon-chrome-copper alloy, or tantalum nitride, or titanium nitride. Material 69 may have improved voltage-coefficient of resistance compared to silicon resistor materials, such as compared to a doped polysilicon material. Material 69 may also have improved temperature-coefficient of resistance, improved (ratio) matching and other characteristics as compared to silicon materials. An insulator layer 67 typically is formed on material 69 to insulate or protect material 69 from other elements of device 50.

Circuit 27 is formed as a plurality of capacitors 29-31 overlying material 69. For example, circuit 27 may be formed on layer 67. Each of capacitors 29-31 is formed as two conductor elements spaced a distance apart with an insulator between the two conductor elements. For example, capacitor 29 may be formed as conductors 70 and 71 that are formed adjacent to each other with a portion of insulator 75 filling the space between conductors 70 and 71. In an embodiment, conductors 70 and 71 may be formed substantially parallel to each other or alternately may be formed as two substantially concentric circles that each have a different radius. Conductor 70 is connected to a first part of material 69 by means of a via 78 through insulator 67, and conductor 71 is connected to a second part of material 69 by means of a via 79 through insulator 67 to connect capacitor 29 in parallel to section 40. Capacitor 30 may be formed by another conductor 72 that is formed adjacent to conductor 71 and spaced a distance apart with anther portion of insulator 75 filling the space therebetween. Conductor 72 is connected to a third part of material 69 by means of another via through insulator 67 to connect capacitor 30 in parallel to section 41. Similarly, capacitor 31 may be formed as conductors 73 and 74 that are formed on layer 67 and spaced a distance apart with another portion of insulator 75 filling the space between conductors 73 and 74. Conductor 73 is connected to a fourth part of material 69 by means of another via through insulator 67, and conductor 74 is connected to a fifth part of material 69 by means of another via through insulator 67 to connect capacitor 31 in parallel to section 42. Conductors 70-74 may have an embodiment that is formed in a pattern of lines that are substantially parallel to each other, or alternately may be formed as substantially concentric circles that each have a different radius. Conductors 70-74 are not physically connected together and are not directly electrically connected together. An embodiment of conductors 70-74 may only be electrically coupled together through corresponding sections 40-42 and through the capacitance of insulator 67. Each of conductors 70-74 are connected to a point within resistor 44, such as for example at the point along the pattern of material 69, as illustrated by the vias and connections between conductors 70-74 and connections or nodes 32, 33, 34, and 35. The material used for conductors may have an embodiment of aluminum, aluminum-copper, or other conductor material.

Figure 3:
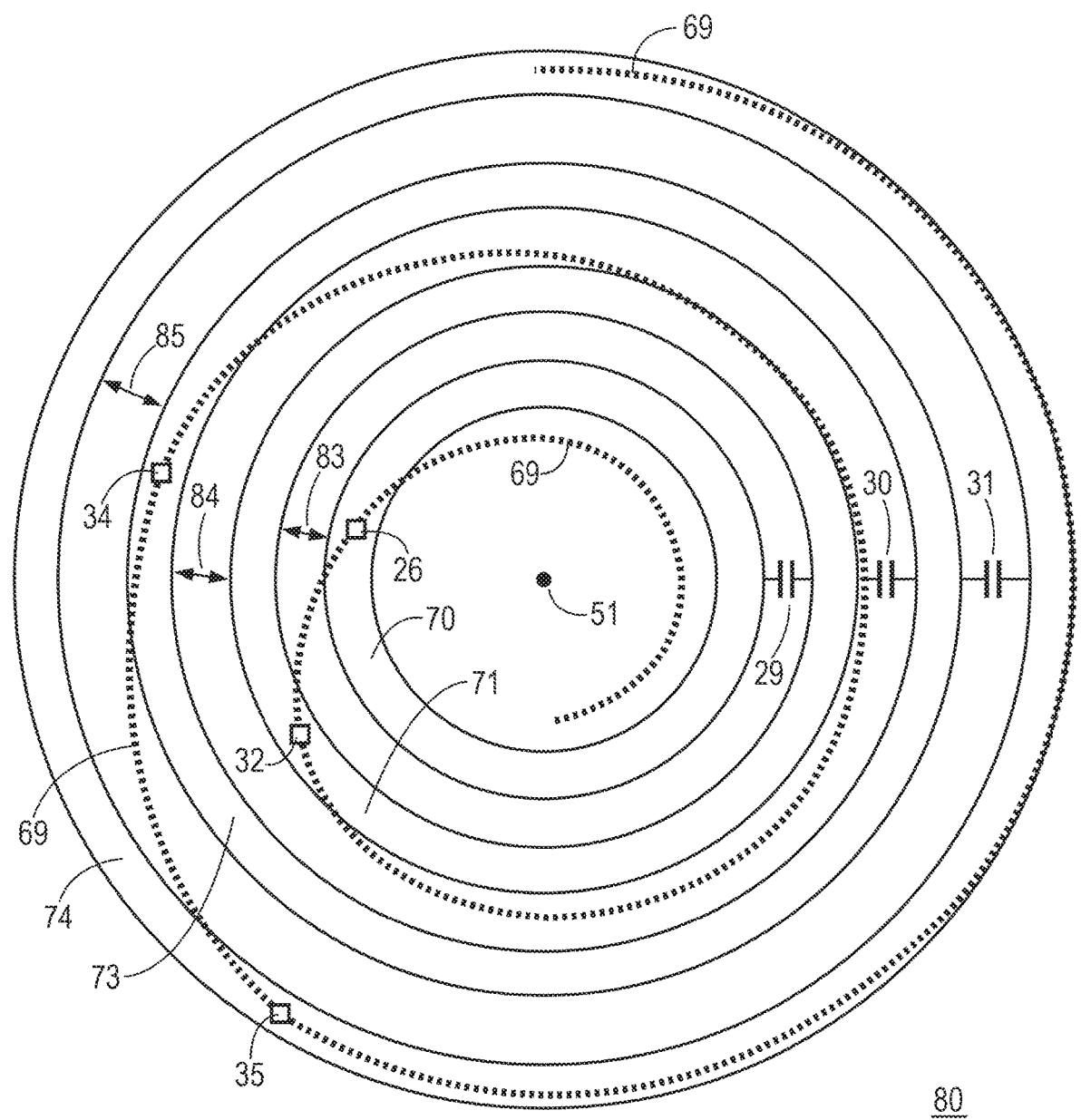
FIG. 3 illustrates an enlarged plan view of an example of a portion of an embodiment of a semiconductor device that may have an embodiment that may be an alternate embodiment of the device of FIG. 2 in accordance with the present invention.

FIG. 3 illustrates an enlarged plan view of an example of a portion of an embodiment of a semiconductor device 80 that may have an embodiment that may be an alternate embodiment of device 50 (FIG. 2). In an embodiment, device 80 includes that material 54, thus, resistor 21, is formed in a spiral pattern. The pattern may be an Archimedean spiral or other spiral pattern such as for example a logarithmetic spiral, a circular spiral, or some other type of spiral pattern. Material 69, thus resistor 44, is also formed in the spiral pattern so that voltage potentials along the length of material 69, or resistor 44, substantially tracks the voltage potential formed along the length or pattern of material 54 during the operation of device 80. An embodiment may include that material 69 may not exactly align with the underlying material 54 as long as the voltage difference between points that substantially overlie each other is low. For example, less than approximately ten volts (10V). An embodiment may include that the voltage differential may be less than approximately forty volts (40 V) Material 69 is illustrated in dashed lines because it is underlying conductors 70-74.

Conductors 70-74 of circuit 27 may have an embodiment that are formed as a plurality of concentric circles centered to the center of the spiral pattern of material 54. Those skilled in the art will appreciate that all of the conductors are not illustrated in FIG. 3 for clarity of the drawings, for example conductor 72 and other conductors of FIG. 2 are omitted. Each of conductors 70-74 have a radius that is larger than a conductor that is closer to the center. For example, conductor 70 is spaced a distance 83 from adjacent conductor 71, conductor 71 is spaced a distance 84 from an adjacent conductor, and conductor 74 is spaced a distance 85 from adjacent conductor 73. Capacitor 29 is formed between conductors 70 and 71 and capacitor 31 is formed between conductors 73 and 74. Because the area of any one of conductors 70-74 is larger than the area of the adjacent conductor, distances 83-85 each have different values so that the capacitance of each of the capacitors of circuit 27 have substantially the same capacitance value. For example, distance 85 is greater than distance 84, and distance 84 is greater than distance 83.

In other embodiments, the length of the outer conductors may be shortened to form each conductor to have substantially the same area so that the capacitance values are substantially the same. For such an embodiment, conductors 71-74 may be arcs of a circle instead of complete circles and distances 83-85 may be substantially the same.

Figure 4:
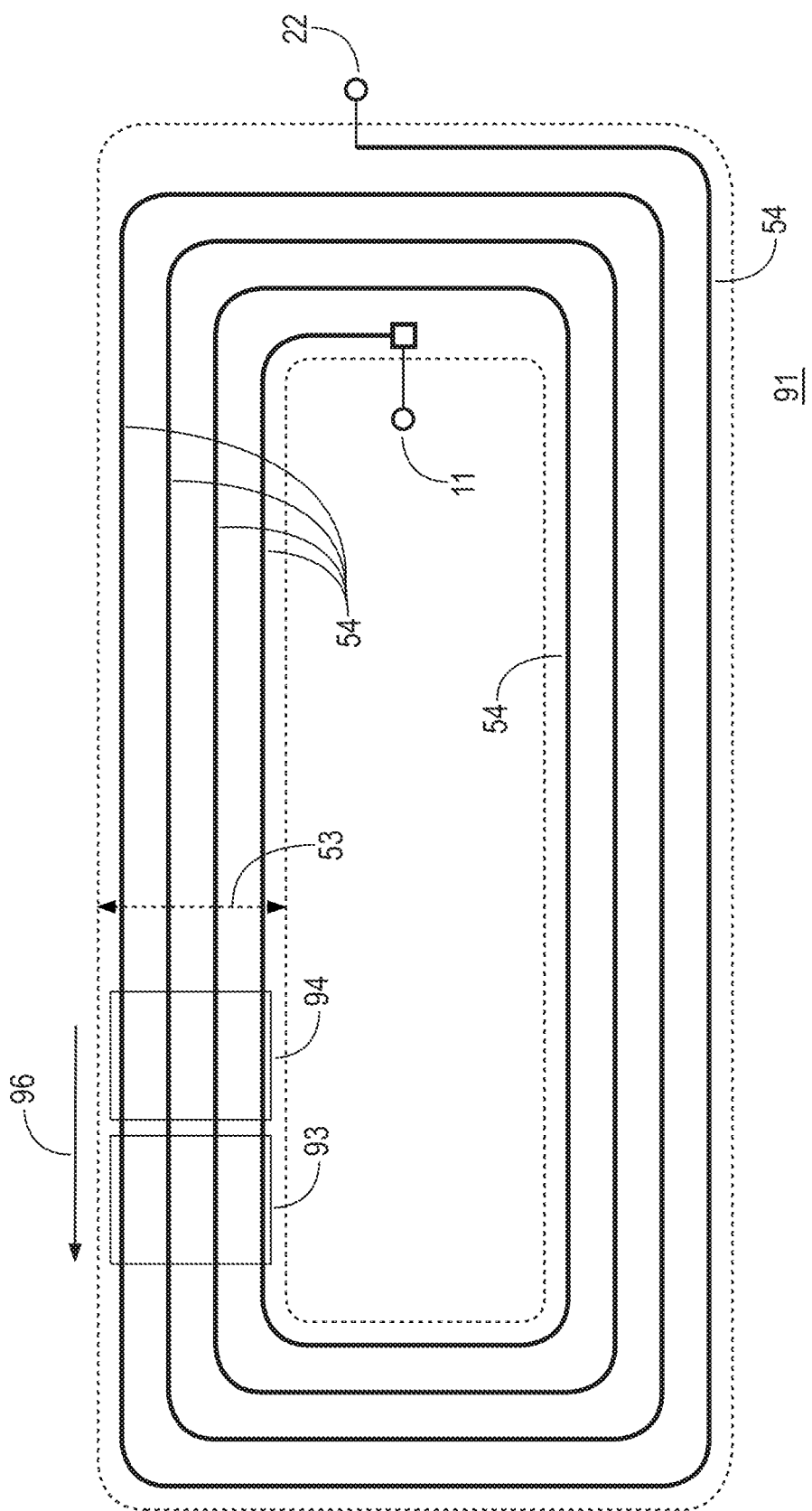
FIG. 4 illustrates an enlarged plan view of an example of a portion of an embodiment of a semiconductor device that may have an embodiment that may be an alternate embodiment of one or more of the devices of FIGS. 2-3 in accordance with the present invention.

FIG. 4 illustrates an enlarged plan view of an example of a portion of an embodiment of a semiconductor device 91 that may have an embodiment that may be an alternate embodiment of either or both of devices 50 or 80 (FIGS. 2-3). Device 91 includes that material 54, thus resistor 21, is formed in a polygon spiral pattern or a spiral pattern that has a polygon shape. For example, the pattern of material 54 may include a plurality of legs or turns around the polygon shape with each turn having an increased distance for the interior of the shape, thus the spiral. For example, individual turns may extend laterally along a direction 96, illustrated by an arrow. In an embodiment, doped region 53 (illustrated by dashed lines and an arrow) may also be formed in the polygon shape, but as a multiply-connected domain and not a spiral.

Resistor circuit 44 is formed overlying at least a portion of material 54, thus, at least a portion of resistor 21. An embodiment of capacitor circuit 27 may be formed overlying at least a portion of material 54 and overlying portions of material 69. As will be seen further hereinafter, circuit 27 may also have an embodiment that does not overlie material 69 as long as capacitors 29-31 are connected to respective sections 40-42. An embodiment of the position of circuits 27 and 44 is illustrated in a general manner by a box 94 and positioned overlying a part of material 54 similar to the explanation of FIG. 2. An alternate embodiment is illustrated by the position of a box 93 and box 94. The electrical potential or alternately the electric field that is formed during operation of device 91 generally decreases along the length of each turn of material 54 in a direction from interior of the polygon shape to the exterior of the polygon shape. Material 69 is formed to overlay a portion of material 54 and extend laterally along the underlying pattern of material 54, for example laterally along direction 96.

Figure 5:
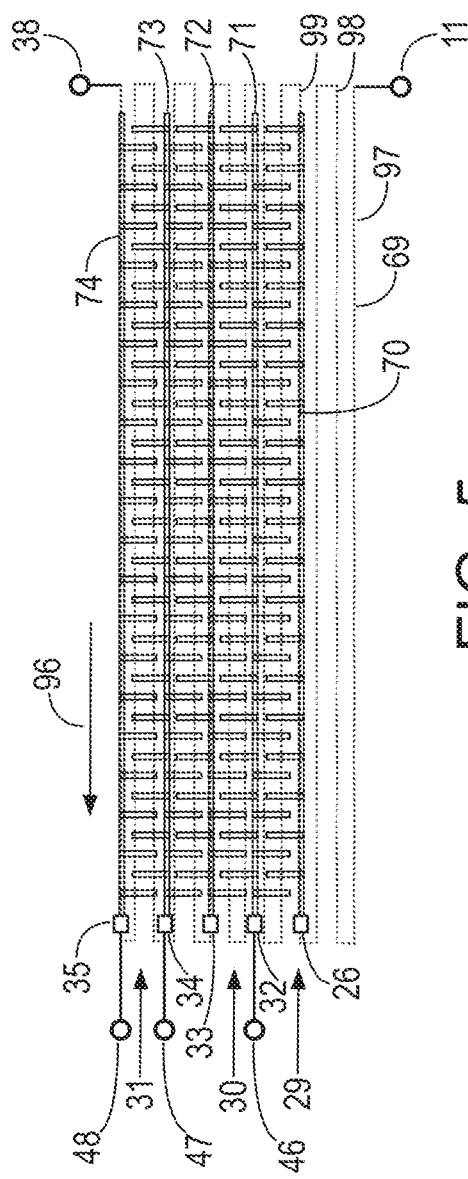
FIG. 5 illustrates an enlarged plan view of an example of a portion of an embodiment of shapes or patterns of some of the elements of FIG. 4 in accordance with the present invention.

FIG. 5 illustrates an enlarged plan view of an example of a portion of an embodiment of the shapes or patterns of material 69 and conductors 70-74, thus respective resistor circuit 44 and capacitors 29-31, that may be within box 94 (FIG. 4). Material 69 is formed as a continuous material that is patterned into a serpentine pattern. Material 69 may be formed on an insulator similarly to the description of FIG. 2. An embodiment of material 69 may be formed as a plurality of straight lines adjacent to and spaced apart from each other, and interconnected at alternating ends of each line. For example, a first leg 97 of material 69 may extend for a distance in direction 96, then an adjacent second leg 98 may extend the distance in a direction opposite to direction 96 and adjacent to leg 97, then an adjacent third leg 99 may extend in the distance in direction 96 and adjacent to leg 98. Each leg of material 69 extends substantially parallel to underlying material 54. Each leg of material 69 may not, in some embodiments, be directly overlying a leg of material 54 but may be positioned between two adjacent legs, or rotational segments, of material 54. For example, material 69 may be wider or narrower than material 54 so it may not be directly over each portion of material 54. In an embodiment, the length of each leg of material 69 is shorter than the length of the underlying turn or rotation portion of material 54.

An embodiment of conductors 70-74 may be formed overlying material 69. For example, formed on insulator 67 (FIG. 2). An embodiment of conductors 70-74 may each be formed as a straight line having fingerlike projections extending from the straight line portion. Interior ones of conductors 71-73 may have fingerlike projections from each long side of the conductors. The fingerlike projections are inter-digitized with the fingerlike projections of the adjacent conductor. Connections to the underlying portions of material 69, such as input 26 and connections 32-35, configures capacitors 29-31 in parallel with corresponding resistor sections 40-42. For example, input 26 and connections 32-35 may include vias through insulator 67.

Figure 6:
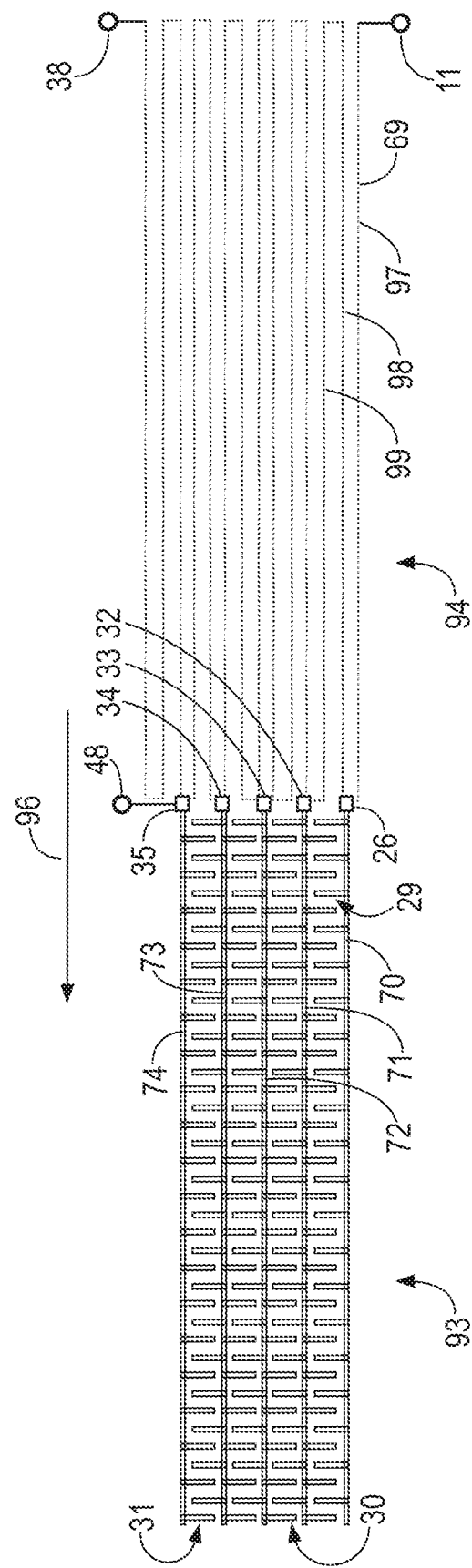
FIG. 6 illustrates an enlarged plan view of an example of a portion of an alternate embodiment of shapes or patterns of some of the elements of FIG. 4 in accordance with the present invention.

FIG. 6 illustrates an enlarged plan view of an example of a portion of an alternate embodiment of the shapes or patterns of material 69 and conductors 70-74, thus respective resistor circuit 44 and capacitor circuit 27, that may be within respective boxes 94 and 93 of FIG. 4. Material 69 is formed in the position of box 94 as explained in the description of FIG. 5. However, an embodiment may include that conductors 70-74 may be formed in the position of box 93, conductors 70-74 may be formed substantially coplanar to material 69 and substantially parallel to the legs of material 69. In an embodiment, conductors 70-74 may be formed on insulator 67 (FIG. 2) and spaced laterally apart from material 69. Conductors 70-74 may be formed to have the same fingerlike interdigitated projections as explained in the description of FIG. 5.

Figure 7:
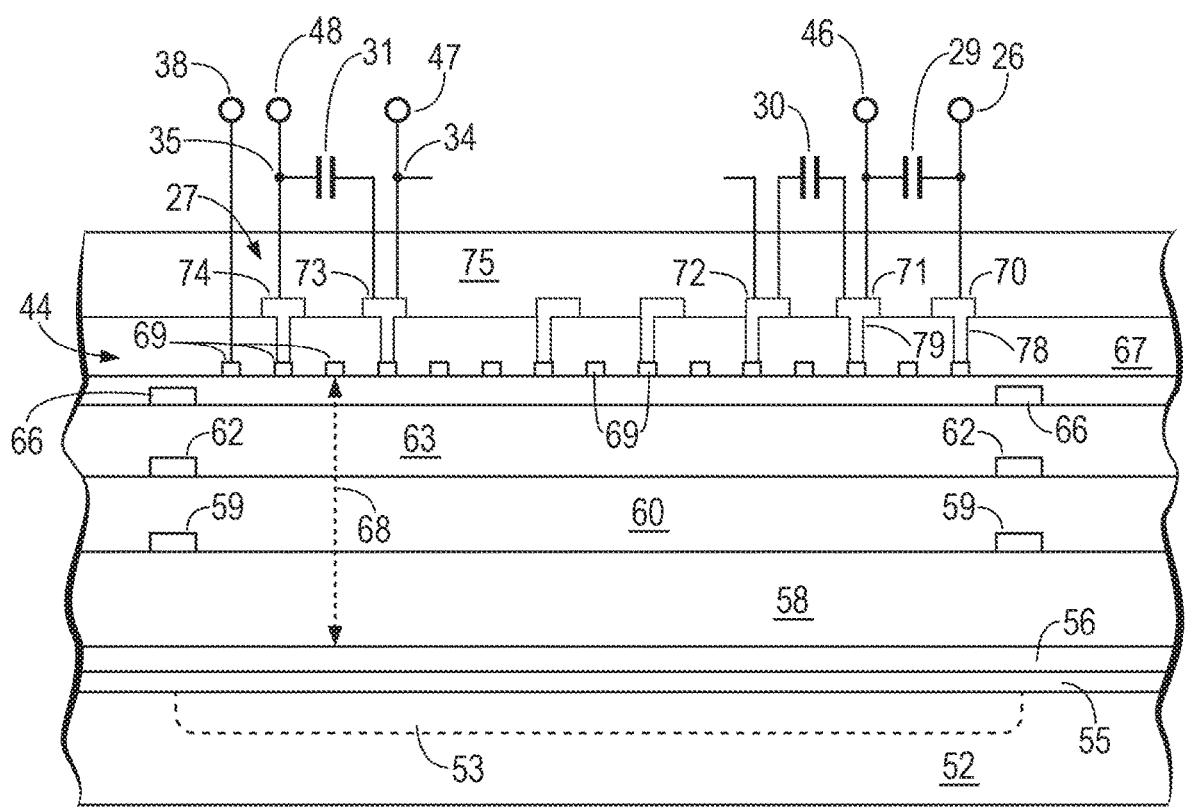
FIG. 7 illustrates an enlarged cross-sectional view of an example of a portion of an embodiment of a semiconductor circuit or semiconductor device that includes an embodiment of the circuit of FIG. 1 in accordance with the present invention.

FIG. 7 illustrates an enlarged cross-sectional view of an example of a portion of an embodiment of a semiconductor circuit or semiconductor device 110 that may have an embodiment that may be an alternate embodiment of device 50 (FIG. 2). Device 110 includes circuit 25 (FIG. 1) including material 69 and conductors 70-74. Device 110 does not include resistor 21 and associated material 54. Device 110 may optionally include transistor 13 and associated region 53 (illustrated by a dashed line). Another embodiment may include that transistor 13 and region 53 do not underlie material 69 and conductors 70-74.

From all the foregoing, one skilled in the art will understand that an example of an embodiment of a circuit for sensing a high voltage may comprise:

a semiconductor substrate, such as for example substrate 52;

a doped region, such as for example region 53, on the semiconductor substrate;

a polysilicon resistor, such as for example region 54, formed in a pattern overlying the doped region;

a plurality of first insulator layers, such as for example one or more of layers 58/60/63, overlying the polysilicon resistor, each first insulator layer having an interconnect conductor, such as for example one or more of conductors 59/62/66, formed thereon;

a silicon-chrome resistor, such as for example material 69, having a length and formed overlying the plurality of first insulator layers, the silicon-chrome resistor overlying the polysilicon resistor and formed in substantially the pattern;

a second insulator, such as for example insulator 67, on the silicon-chrome resistor including on sides of the silicon-chrome resistor;

a plurality of metal-insulator-metal capacitors, such as for example one or more of capacitors 29/30/31, on the second insulator and overlying at least a part of the silicon-chrome resistor, each metal-insulator-metal capacitor connected in parallel with portions of the silicon-chrome resistor, a first metal-insulator-metal capacitor of the plurality of metal-insulator-metal capacitors including a first metal layer, such as for example conductor 71, spaced a distance apart from a second metal layer, such as for example conductor 72, with a first portion of a third insulator, such as for example insulator 75, between the first metal layer and the second metal layer;

the first metal layer connected at a first point along the length of the silicon-chrome resistor;

the second metal layer connected at a second point along the length of the silicon-chrome resistor; and a third point along the length of the silicon-chrome resistor configured to form an output signal.

In an embodiment the pattern is a spiral.

An embodiment may include that the first metal layer may be formed as a circle having a first radius from a center of the spiral and the second metal layer is formed a second circle having a second radius from the center of the spiral wherein the second radius is different from the first radius.

The circuit may have an embodiment including a first terminal of the silicon-chrome resistor is configured to receive a high voltage signal.

In an embodiment the third insulator may be on the first metal layer and on the second metal layer.

Another embodiment may include a second metal-insulator-metal capacitor of the plurality of metal-insulator-metal capacitors, the second metal-insulator-metal capacitor including a third metal layer spaced the distance apart from the second metal layer with a second portion of the third insulator between the third metal layer and the second metal layer.

In an embodiment the first metal layer may have a first plurality of fingers extending from the first metal layer toward the second metal layer.

An embodiment may include that the second metal layer may have a second plurality of fingers extending from the second metal layer toward the first metal layer wherein the second plurality of fingers is inter-digitized with the first plurality of fingers.

An embodiment of the circuit may include that the plurality of first insulator layers may include at least three insulator layers.

An embodiment of the doped region may include a portion of a junction field effect transistor.

Those skilled in the art will appreciate that an example of an embodiment of a circuit for high voltage sensing may comprise:

a semiconductor substrate, such as for example substrate 52;

a doped region, such as for example region 53, on the semiconductor substrate wherein the doped region is a portion of a field effect transistor, such as for example transistor 13;

a polysilicon resistor, such as for example material 54, formed in a pattern overlying the doped region;

a plurality of first insulator layers, such as for example one or more of layers 58/60/63, overlying the polysilicon resistor;

an interconnect conductor, such as for example one or more of conductors 59/62/66, formed on one or more of the plurality of first insulator layers;

a resistor, such as for example material 69, formed in substantially the pattern, the resistor overlying the plurality of first insulator layers and at least a portion of the polysilicon resistor;

a second insulator layer, such as for example layer 67, formed on the resistor;

a first metal layer, such as for example conductor 71, on the second insulator layer and extending in a direction across the second insulator layer, the first metal layer connected to a first part of the resistor, such as for example a point underlying conductor 71;

a second metal layer, such as for example conductor 72, on the second insulator layer and spaced a distance from the first metal layer to form a first space therebetween, the second metal layer extending in the direction across the second insulator layer, the second metal layer connected to a second part of the resistor, such as for example a point under conductor 72;

a third insulator, such as for example insulator 75, having a first portion in the first space, such as for example between 71 and 72; and an output, such as for example output 48, connected to a third part of the resistor, the output configured to form a sense signal.

An embodiment may include that the resistor may be formed from one of titanium nitride, tantalum nitride, a silicon-chrome alloy, a nickel-chrome alloy, or a silicon-chrome-carbon alloy.

In an embodiment of the polysilicon resistor may not form an output signal.

In an embodiment the resistor may have a first terminal configured to receive a high voltage and to form a signal representative of the high voltage on the output.

An embodiment may include that a drain of the field effect transistor may be coupled to a first terminal of the resistor and to receive the high voltage.

In an embodiment, the first metal layer, the second metal layer, and the first portion of the third insulator form a capacitor, such as for example capacitor 29, connected in parallel to a portion, such as for example section 40, of the resistor.

An embodiment may also include a third metal layer, such as for example conductor 73, on the second insulator layer and extending in the direction across the second insulator layer, the third metal layer spaced apart from the second metal layer to form a second space therebetween, a third portion of the third insulator, such as for example insulator 75, in the second space, the third metal layer connected to a fourth part, such as for example a point underlying 73, of the resistor wherein the second metal layer, the third metal layer, and the third portion of third insulator form a capacitor, such as for example capacitor 31, connected in parallel with a portion, such as for example section 41, of the resistor.

Those skilled in the art will appreciate that an example of an embodiment of a method of forming a semiconductor device may comprise:

forming a sense resistor to receive a high voltage signal and form a sense signal that is representative of the high voltage signal;

forming a plurality of first insulator layers underlying the sense resistor overlying a semiconductor substrate; and forming a plurality of capacitors in parallel to portions of the sense resistor wherein the plurality of capacitors are connected together in series.

An embodiment of the method may also include forming a polysilicon resistor overlying an active region of a transistor wherein the polysilicon resistor receives the high voltage signal but does not form an output signal that is representative of the high voltage signal.

In an embodiment, the method may include forming the sense resistor on a second insulator that is overlying the plurality of first insulator layers and forming the plurality of capacitors one of overlying sections of the sense resistor or on the second insulator spaced laterally from the sense resistor.

In view of all of the above, it is evident that a novel device and method is disclosed. Included, among other features, is forming a device having a sense circuit overlying and spaced a distance above a field plate of the device. The sense circuit may be a sense resistor. Capacitors are connected in parallel with sections of the sense resistor. The capacitors improve the bandwidth, the frequency response, and the transient response of the device. The resistor may have an improved temperature and voltage coefficient, an improved drift over time, improved matching, and provide a more reliable sense signal.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A circuit for sensing a high voltage comprising:
    a semiconductor substrate;
    a doped region on the semiconductor substrate;
    a polysilicon resistor formed in a pattern overlying the doped region;
    a plurality of first insulator layers overlying the polysilicon resistor, each first insulator layer having an interconnect conductor formed thereon;
    a silicon-chrome resistor having a length and formed overlying the plurality of first insulator layers, the silicon-chrome resistor overlying the polysilicon resistor and formed in substantially the pattern;
    a second insulator on the silicon-chrome resistor including on sides of the silicon-chrome resistor;
    a plurality of metal-insulator-metal capacitors on the second insulator and overlying at least a part of the silicon-chrome resistor, each metal-insulator-metal capacitor connected in parallel with portions of the silicon-chrome resistor, a first metal-insulator-metal capacitor of the plurality of metal-insulator-metal capacitors including a first metal layer spaced a distance apart from a second metal layer with a first portion of a third insulator between the first metal layer and the second metal layer;
    the first metal layer connected at a first point along the length of the silicon-chrome resistor;
    the second metal layer connected at a second point along the length of the silicon-chrome resistor; and
    a third point along the length of the silicon-chrome resistor configured to form an output signal.

2. The circuit of claim 1 wherein the pattern is a spiral.

3. The circuit of claim 2 wherein the first metal layer is formed as a circle having a first radius from a center of the spiral and the second metal layer is formed a second circle having a second radius from the center of the spiral wherein the second radius is different from the first radius.

4. The circuit of claim 1 wherein a first terminal of the silicon-chrome resistor is configured to receive a high voltage signal.

5. The circuit of claim 1 wherein the third insulator is on the first metal layer and on the second metal layer.

6. The circuit of claim 1 further including a second metal-insulator-metal capacitor of the plurality of metal-insulator-metal capacitors, the second metal-insulator-metal capacitor including a third metal layer spaced the distance apart from the second metal layer with a second portion of the third insulator between the third metal layer and the second metal layer.

7. The circuit of claim 1 wherein the first metal layer has a first plurality of fingers extending from the first metal layer toward the second metal layer.

8. The circuit of claim 7 wherein the second metal layer has a second plurality of fingers extending from the second metal layer toward the first metal layer wherein the second plurality of fingers is inter-digitized with the first plurality of fingers.

9. The circuit of claim 1 wherein the plurality of first insulator layers includes at least three insulator layers.

10. The circuit of claim 1 wherein the doped region is a portion of a junction field effect transistor.

11. A circuit for high voltage sensing, the circuit comprising:
    a semiconductor substrate;

a doped region on the semiconductor substrate wherein the doped region is a portion of a field effect transistor;

a polysilicon resistor formed in a pattern overlying the doped region;

a plurality of first insulator layers overlying the polysilicon resistor;

an interconnect conductor formed on one or more of the plurality of first insulator layers;

a resistor formed in substantially the pattern, the resistor overlying the plurality of first insulator layers and at least a portion of the polysilicon resistor;

a second insulator layer formed on the resistor;

a first metal layer on the second insulator layer and extending in a direction across the second insulator layer, the first metal layer connected to a first part of the resistor;

a second metal layer on the second insulator layer and spaced a distance from the first metal layer to form a first space therebetween, the second metal layer extending in the direction across the second insulator layer, the second metal layer connected to a second part of the resistor;

a third insulator having a first portion in the first space; and an output connected to a third part of the resistor, the output configured to form a sense signal.

12. The circuit of claim 11 wherein the resistor is formed from one of titanium nitride, tantalum nitride, a silicon-chrome alloy, a nickel-chrome alloy, or a silicon-chrome-carbon alloy.

13. The circuit of claim 11 wherein the polysilicon resistor does not form an output signal.

14. The circuit of claim 11 wherein the resistor has a first terminal configured to receive a high voltage and to form a signal representative of the high voltage on the output.

15. The circuit of claim 14 wherein a drain of the field effect transistor is coupled to a first terminal of the resistor and to receive the high voltage.

16. The circuit of claim 11 wherein the first metal layer, the second metal layer, and the first portion of the third insulator form a capacitor connected in parallel to a portion of the resistor.

17. The circuit of claim 11 further including a third metal layer on the second insulator layer and extending in the direction across the second insulator layer, the third metal layer spaced apart from the second metal layer to form a second space therebetween, a third portion of the third insulator in the second space, the third metal layer connected to a fourth part of the resistor wherein the second metal layer, the third metal layer, and the third portion of third insulator form a capacitor connected in parallel with a portion of the resistor.

18. A method of forming a semiconductor device comprising:

forming a sense resistor to receive a high voltage signal and form a sense signal that is representative of the high voltage signal;

forming a plurality of first insulator layers underlying the sense resistor overlying a semiconductor substrate; and forming a plurality of capacitors in parallel to portions of the sense resistor wherein the plurality of capacitors is connected together in series.

19. The method of claim 18 further including forming a polysilicon resistor overlying an active region of a transistor wherein the polysilicon resistor receives the high voltage signal but does not form an output signal that is representative of the high voltage signal.

20. The method of claim 18 including forming the sense resistor on a second insulator that is overlying the plurality of first insulator layers and forming the plurality of capacitors one of overlying sections of the sense resistor or on the second insulator spaced laterally from the sense resistor.

* * * * *